(12) United States Patent
Godet et al.

(10) Patent No.: US 7,927,986 B2
(45) Date of Patent: Apr. 19, 2011

(54) ION IMPLANTATION WITH HEAVY HALOGENIDE COMPOUNDS

(75) Inventors: Ludovic Godet, North Reading, MA (US); George D. Papasouliotis, North Andover, MA (US); Edwin Arevalo, Haverhill, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 103 days.

(21) Appl. No.: 12/177,750

(22) Filed: Jul. 22, 2008

(65) Prior Publication Data

US 2010/0022076 A1   Jan. 28, 2010

(51) Int. Cl.
H01L 21/26 (2006.01)
(52) U.S. Cl. ........... 438/513; 438/506; 257/E21.247; 257/E21.316; 216/75; 216/76
(58) Field of Classification Search .......... 438/513, 438/506, 514; 257/E21.247, E21.248, E21.315, 257/E21.316, E21.467; 216/74, 75, 76
See application file for complete search history.

(56) References Cited

U.S. PATENT DOCUMENTS

| | | | |
|---|---|---|---|
| 4,086,102 A | 4/1978 | King | |
| RE31,151 E | 2/1983 | King | |
| 5,444,259 A | 8/1995 | Ohmi | |
| 5,489,550 A * | 2/1996 | Moslehi | ......................... 438/565 |
| 5,720,826 A * | 2/1998 | Hayashi et al. | ............... 136/249 |
| 6,319,355 B1 | 11/2001 | Holland | |
| 6,984,591 B1 | 1/2006 | Buchanan et al. | |
| 7,037,813 B2 | 5/2006 | Collins et al. | |
| RE39,988 E | 1/2008 | Wickboldt et al. | |
| 2002/0028349 A1 | 3/2002 | Seo | |
| 2005/0205212 A1 | 9/2005 | Singh et al. | |
| 2006/0063361 A1 | 3/2006 | Kumar et al. | |
| 2006/0236931 A1 | 10/2006 | Singh et al. | |
| 2006/0264051 A1 * | 11/2006 | Thibaut | ......................... 438/690 |
| 2007/0059848 A1 * | 3/2007 | Sasaki et al. | .................... 438/14 |
| 2007/0084564 A1 | 4/2007 | Gupta et al. | |
| 2007/0087574 A1 | 4/2007 | Gupta et al. | |
| 2007/0170867 A1 | 7/2007 | Persing et al. | |
| 2007/0224840 A1 | 9/2007 | Renau et al. | |
| 2007/0227231 A1 | 10/2007 | Koo et al. | |
| 2007/0284695 A1 * | 12/2007 | Zani et al. | ..................... 257/607 |
| 2008/0132046 A1 | 6/2008 | Walther | |

OTHER PUBLICATIONS

Hertel, et al., Plasma Source With Liner For Reducing Metal Contamination, U.S. Appl. No. 11/623,739, filed Jan. 16, 2007.
Miller, et al., Multi-Step Plasma Doping With Improved Dose Control, U.S. Appl. No. 11/676,069, filed Feb. 16, 2007.
Singh, et al., Plasma Doping With Enhanced Charge Neutralization, U.S. Appl. No. 11/771,190, filed Jun. 29, 2007.
Walther, Conformal Doping Using High Neutral Density Plasma Implant, U.S. Appl. No. 11/774,587, filed Jul. 7, 2007.
Gupta, et al., Plasma Doping System With In-Situ Chamber Condition Monitoring, U.S. Appl. No. 11/877,312, filed Oct. 23, 2007.

(Continued)

*Primary Examiner* — Caridad M Everhart (57) ABSTRACT

A method of plasma doping includes providing a dopant gas comprising a dopant heavy halogenide compound gas to a plasma chamber. A plasma is formed in the plasma chamber with the dopant heavy halogenide compound gas and generates desired dopant ions and heavy fragments of precursor dopant molecule. A substrate in the plasma chamber is biased so that the desired dopant ions impact the substrate with a desired ion energy, thereby implanting the desired dopant ions and the heavy fragments of precursor dopant molecule into the substrate, wherein at least one of the ion energy and composition of the dopant heavy halogenide compound is chosen so that the implant profile in the substrate is substantially determined by the desired dopant ions.

25 Claims, 7 Drawing Sheets

OTHER PUBLICATIONS

Jeon, et al., Plasma Doping System With Charge Control, U.S. Appl. No. 11/875,062, filed Oct. 19, 2007.

Raj, et al., Closed Loop Control And Process Optimization In Plasma Doping Processes Using A Time Of Flight Ion Detector, U.S. Appl. No. 12/029,710, filed Feb. 12, 2008.

Gwilliam, R., Boron Bromide As A Source Precursor For Low Energy Applications, IEEE, 2002, pp. 395-398, University of Surrey, UK.

* cited by examiner

|  | BI3 | PI3 | P2I4 | AsI3 | (AsI2)2 | PBr3 | AsBr3 |
|---|---|---|---|---|---|---|---|
| Melting point, C |  | 43 | 61 | 126 | 141 (decomposes) | -41.5 | 31 |
| Boiling point, C |  | 210 | 227 | 424 |  | 173 | 221 |
| MW | 391.5 | 411.7 | 569.6 | 455.6 | 657.5 | 271 | 314.6 |
| Density, g/cm3 |  | 4 | 4.2 | 4.39 |  | 2.92 | 3.4 |
| Pvap, Torr | 5.26 @ 63.4 C |  |  | 0.015 @ 35C |  |  |  |

FIG. 2

|  | Bond enthalpy, kJ/mol |
|---|---|
| BI | 220.5 |
| BH | 340 |
| BF | 757 |
| PH | 297 |
| PF | 440 |
| PI | <<297 |
| AsH | 274 |
| ASF | 410 |
| ASI | 296.6 |

| Energy, keV | 10 | 5 | 2.5 | 1 | 0.5 |
|---|---|---|---|---|---|
| B | 400 | 212 | 117 | 56 | 34 |
| BI | 48 | 29 | 19 | 11 | 7 |
| BI2 | 29 | 19 | 12 | 7 | 5 |
| BI3 | 23 | 15 | 10 | 6 | 4 |

ION IMPLANTATION WITH HEAVY HALOGENIDE COMPOUNDS

The section headings used herein are for organizational purposes only and should not to be construed as limiting the subject matter described in the present application.

BACKGROUND OF THE INVENTION

Ion implantation has been used in the semiconductor and other industries for many decades to modify the composition of substrate material. In particular, beam-line and cluster beam ion implantation systems are widely used today in the semiconductor industry. Beam-line and cluster beam ion implantation systems accelerate ions with an electric field and then select ions with the desired mass-to-charge ratio. The selected ions are then implanted into the substrate, thereby doping the substrate with the desired dopant material. These systems have excellent process control, excellent run-to-run uniformity, and provide highly uniform doping across the entire surface of state-of-the art semiconductor substrates.

Recently, plasma doping has been used to dope substrates. Plasma doping is sometimes referred to as PLAD or plasma immersion ion implantation (PIII). Plasma doping systems have been developed to meet the doping requirements of state-of-the-art electronic and optical devices. Plasma doping systems are fundamentally different from conventional beam-line and cluster beam ion implantation systems. Plasma doping systems immerse the substrate in a plasma containing dopant ions and then bias the substrate with a series of negative voltage pulses. The negative bias on the substrate repels electrons from the surface of the substrate, thereby creating a sheath of positive ions. The electric field within the plasma sheath accelerates ions toward the substrate, thereby implanting the ions into the surface of the substrate.

BRIEF DESCRIPTION OF THE DRAWINGS

The aspects of this invention may be better understood by referring to the following description in conjunction with the accompanying drawings. Identical or similar elements in these figures may be designated by the same reference numerals. Detailed description about these similar elements may not be repeated. The drawings are not necessarily to scale. The skilled artisan will understand that the drawings, described below, are for illustration purposes only. The drawings are not intended to limit the scope of the present teachings in any way.

DETAILED DESCRIPTION

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

It should be understood that the individual steps of the methods of the present invention may be performed in any order and/or simultaneously as long as the invention remains operable. Furthermore, it should be understood that the apparatus and methods of the present invention can include any number or all of the described embodiments as long as the invention remains operable.

The present teachings will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teachings herein will recognize additional implementations, modifications, and embodiments, as well as other fields of use, which are within the scope of the present disclosure as described herein. For example, although some embodiments of the present invention are described in connection with plasma doping, one skilled in the art will appreciate that the methods of the present invention can used with any type of ion implantation, such as conventional beam line ion implantation.

Three dimensional device structures are now being developed to increase the available surface area of ULSI circuits as well as to extend the device scaling to sub 65 nm dimensions. For example, three-dimensional trench capacitors used in DRAMs, and numerous types of devices using vertical channel transistors, such as FinFETs (Double or Triple gate) and recessed channel array transistors (RCAT), are being developed for state-of-the art systems. Many of these three-dimensional devices require very precise control of the ion implant profiles in the substrate. In addition, numerous other types of modern electronic and optical devices and nanotechnology microstructures require very precise control of the depth of ion implant dopant profiles in the substrate.

Plasma doping is particularly useful for applications that require very precise control of the depth of ion implant dopant profiles. In plasma doping, the ionized species present in the plasma are extracted and implanted by applying negative voltage pulses to the substrate. The control of the dopant profile in the substrate depends on the relative abundance of each ion species as well as the particular ion energy distribution prior to entering the surface of the substrate. Plasma doping ion implant profiles are essentially a combination of many individual ion implantation profiles where each of the individual ion profiles has a particular ion energy distribution. The combined ion implant profile reflects the relative number of ions in each of the individual ion profiles that enter into the surface of the substrate.

The ion implant dopant profile also depends upon the control of the deposition and etching which results from the plasma doping process. For example, during plasma doping, there is some unintentional etching of the surface of the substrate caused by physically sputtering and chemical etching. There is also some unintentional deposition. Furthermore, there can be a significant ion implant energy distribution due to many factors, such as the presence of multiple ion species, collisions between ions, non uniformities in the plasma sheath, presence of secondary electron emissions, displacements currents formed due to parasitic impedances, and the application of non-ideal bias pulses.

In addition, plasma doping reactors typically have undesirable ionic species present in the reactor during doping that result in co-implantation of some undesirable ionic species with the desired dopant ions. One type of undesirable ionic species present in the reactor during plasma doping results from the ionization of fragments of the dopant gas feedstock. The presence of the ionized fragments of the dopant gas feedstock results in the co-implantation of the ionizing fragments of the dopant gas feedstock into the substrate along with the desired dopant ions.

One common dopant gas feedstock for P-type doping is $BF_3$. The $BF_3$ dopant gas feedstock fragments when ionized into $B_xF_y$, where x and y are greater than 1. Typically $BF_3$ dopant gas molecules ionizes to form $B^+$ atom ions and $BF^+$, $BF_2^+$, and $BF_3^+$ molecular fragment ions. The $BF^+$, $BF_2^+$, and $BF_3^+$ molecular fragment ions are relatively heavy weight ionic species that implant near the surface of the substrate. The plasma formed in the plasma doping reactor typically includes boron ions and all the molecular fragment ions.

The $BF_2^+$ ion is typically the dominant molecular fragment ion when $BF_3$ is ionized. The ratio of the particular molecular fragment ions formed from the $BF_3$ dopant gas molecules varies with the plasma conditions. The ratio of the $BF_2^+$ ion to the total ion flux reaching the substrate can be increased to about 90% by properly choosing the plasma conditions. However, there is typically always some $B^+$ ions present in the plasma chamber. The fraction of $B^+$ ions and $BF_2^+$ ions is important because these fractions control the junction depth of the plasma implant.

In order to maintain the required junction depth for many plasma doping processes, the ion implant energy must be limited due to the fraction of $BF_2^+$ ions that reach the substrate. See for example, L. Godet, Ph.D. Thesis, University of Nantes, 2006. Therefore, it is highly desirable to increase the fraction of $BF_2^+$ ions in the plasma chamber above the 90% level that is currently achieved in plasma doping apparatus. Similarly, it is highly desirable to increase the fraction of the desired implant ions in other plasma doping processes.

Another type of undesirable ionic species present in the plasma chamber during plasma doping results from ionization of diluent gas atoms, such as He atoms, and fragments of diluent gas molecules, such as H fragments of $H_2$ gas molecules that are present in the dopant gas feedstock. The presence of the ionized diluent gas atoms and molecule fragments, such as He and H, result in the co-implantation of undesired species with the desired dopant ions into the substrate.

The ionized diluent gas atoms and fragments of diluent gas molecules are relatively light weight ion species so they tend to implant relatively far into the substrate being plasma doped. For example, one common dopant gas for P-type plasma doping is a $B_2H_6$ mixture with $H_2$ or He diluent gases. Plasma doping with $B_2H_6$ mixtures having $H_2$ or He diluent gases results in the formation of ionized H fragments or ionized He atoms that are co-implanted with the boron in large quantities deep into the silicon substrate. The projected ranges of these ionized H fragments or ionized He atoms can be as high as ten times the projected range of the desired boron ion dopant ions.

Similarly, $BF_3$ is another common P-type dopant gas. Plasma doping with $BF_3$ results in the formation of F and $BF_2^+$ ions that are co-implanted with the boron. It has been discovered that the co-implantation of F during a $BF_2^+$ beam line ion implantation in polysilicon can create F bubbles. In addition, it has been discovered that the co-implantation of F during a $BF_2^+$ beam line ion implantation in polysilicon reduces the boron diffusion and boron activation.

Figure 1A:
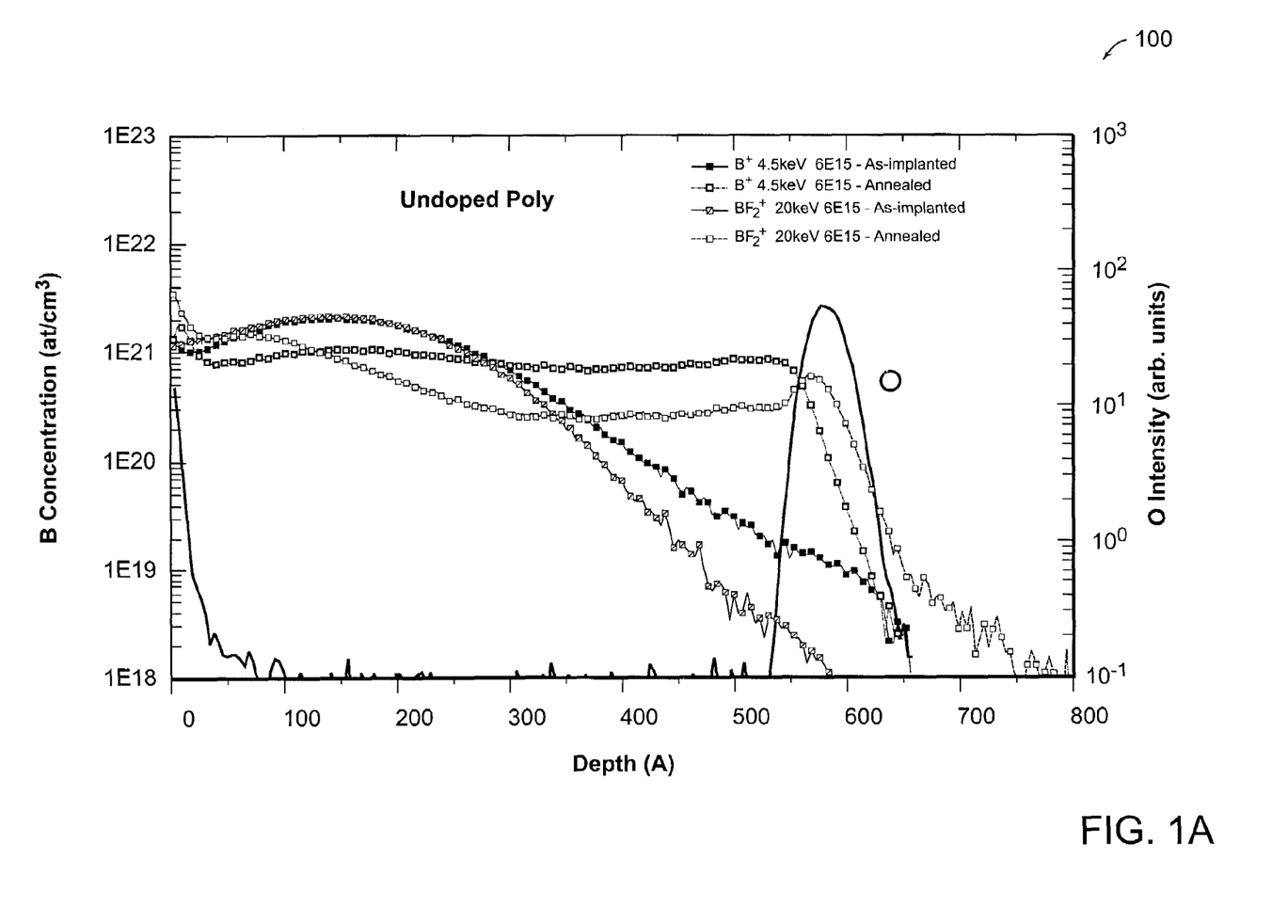
FIG. 1A illustrates boron and fluorine secondary ion mass spectrometer (SIMS) analysis profiles before and after annealing for a boron ion implant into polysilicon with an ion implant energy equal to 4.5 keV.

FIG. 1A illustrates boron secondary ion mass spectrometer (SIMS) analysis profiles 100 before and after annealing for a boron ion implant into polysilicon with an ion implant energy equal to 4.5 keV and a $BF_2^+$ ion implant into polysilicon with an ion implant energy equal to 20 keV. The SIMS analysis profiles 100 show the intensity of the secondary ions detected and the calibrated boron concentration in atoms per cubic centimeter as a function of depth in Angstroms into the surface of the substrate.

The SIMS analysis profiles 100 of the as-implanted SIMS shows similar retrograde profile for the $B^+$ 4.5 keV and the $BF_2$+ 20 keV implant. After anneal, the SIMS analysis profiles 100 indicate that there is a lower boron concentration near the interface and, consequently, reduced boron diffusion and activation near the interface in the case of a $BF_2^+$20 keV implant.

Figure 1B:
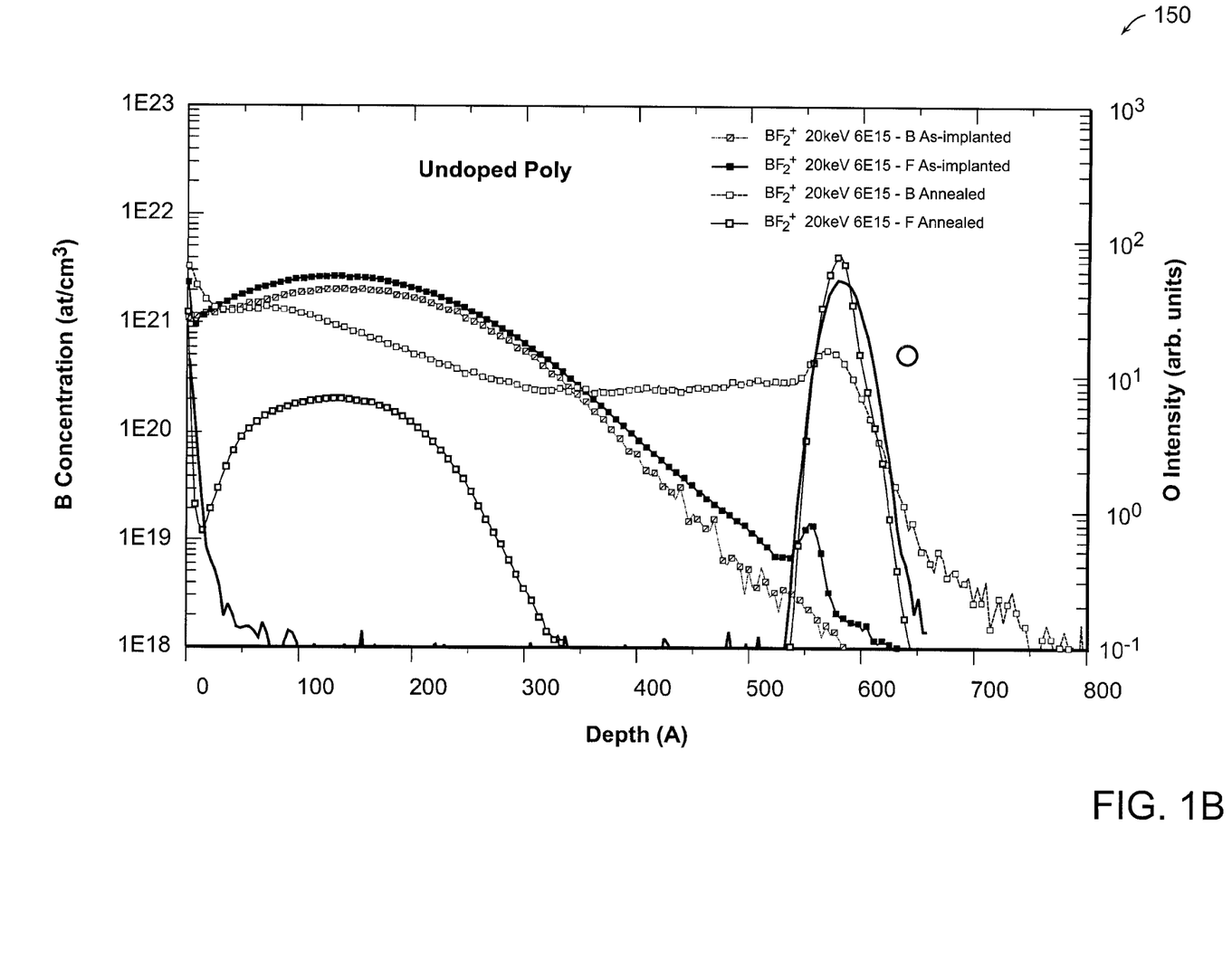
FIG. 1B illustrates boron and fluorine secondary ion mass spectrometer analysis profiles before and after annealing for a boron ion implant into polysilicon with an ion implant energy equal to 20 keV.

FIG. 1B illustrates boron and fluorine secondary ion mass spectrometer (SIMS) analysis profiles 150 before and after annealing for a $BF_2^+$ ion implant into polysilicon with an ion implant energy equal to 20 keV. The SIMS analysis profiles 150 show the intensity of the secondary ions detected and the calibrated boron and fluorine concentration in atoms per cubic centimeter as a function of depth in Angstroms into the surface of the substrate. The SIMS analysis profiles 150 indicate there is a significant percent of F remaining in the gate oxide after annealing in the case of a $BF_2$+ 20 keV implant. The presence of F remaining in the gate oxide after annealing in the case of a $BF_2$+ 20 keV implant can significantly reduce the lifetime of the resulting device and/or decrease the device performance.

Thus, state-of-the-art plasma doping reactors using common dopant gas feedstock, such as $BF_3$ and $B_2H_6$, can not optimize the bulk plasma composition and collisions within the plasma sheath to generate a substantially single type of ion in the plasma chamber. In addition, the ionic species generated by ionizing the gas atoms and fragments of diluent gas molecules causes co-implantation of undesirable species with the desired implant species. The co-implantation can limit dopant ion incorporation in the bulk of the substrate being plasma doping. Also, the co-implantation results in the presence of undesirable ions, such as H, He, and F ions, in the substrate that can form bubbles and cavities in the substrate that can be a source of residual defects after annealing. Also, the co-implantation can form bubbles and cavities in the substrate during post ion implantation processing. The resulting bubbles and cavities can prevent proper re-crystallization of the substrate material and create obstacles for integrating the plasma doping process into the semiconductor manufacturing process. In addition, the co-implantation can limit process window for many plasma doping processes.

The generation of undesirable ionic species that results in the co-implantation of undesired species with the desired dopant ions into the substrate is difficult to monitor in plasma doping systems because such systems typically do not have mass analysis capabilities. Consequently, the co-implantation of undesired species into the substrate is difficult to eliminate in plasma doping systems. In contrast, monitoring undesirable ionic species that result in the co-implantation of undesired species into the substrate is generally easier in traditional beam line ion implantation system, which typically includes spectrum analyzers. Consequently, the co-implantation of undesired species into the substrate is less difficult to eliminate in traditional beam line ion implantation system.

One aspect of the present invention relates to method and apparatus for mitigating the generation of undesirable ionic species and the resulting co-implantation of undesired species into the substrate. In particular, the methods of the present invention increase or maximize the implantation of un-substituted dopant ions in the substrate and reduce or eliminate the presence of co-implanted random fragments in the substrate. The methods of the present invention can be applied to numerous ion implantation processes, such as dual poly gate ion implantation processes, many types of source-drain ion implantation processes, ultra-shallow junction ion implantation processes, stained layer ion implantation processes, and many types of ion implantation processes used for material modifications. The methods of the present invention are not limited to plasma doping, but rather can be used with any type of doping.

Methods according to one embodiment of the present invention use particular dopant gases which maximize the generation of the desired dopant ions and, therefore, the implantation of un-substituted dopant ions in the substrate. These gases also mitigate the generation of undesirable ionic species and the resulting co-implantation of undesired species into the substrate. Also, in some embodiments, these gases can be used to more precisely control the depth of the plasma doping profile. In addition, in some embodiments, these gases can be used to balance the etching and deposition that occurs during plasma doping.

In one particular embodiment of the present invention, heavy halogenated compounds are incorporated into the N-type or P-type dopant gas feedstock to maximize the generation of the desired dopant ions, to more precisely control the depth and doping profile of the plasma doping profile, and to balance the etching and deposition that occurs during plasma doping. In one embodiment, iodine and bromine compounds of N-type or P-type dopant gas feedstock are used as the dopant gas feedstock. For example, in one embodiment, $BI_3$ is used as a P-type dopant gas feedstock for plasma doping to enable tight control over the resulting dopant profile. In another embodiment, $GeI_4$ gas feedstock is used as a pre-amorphization agent. In yet another embodiment, $GeI_4$ gas feedstock is used to create strain.

Figure 2:
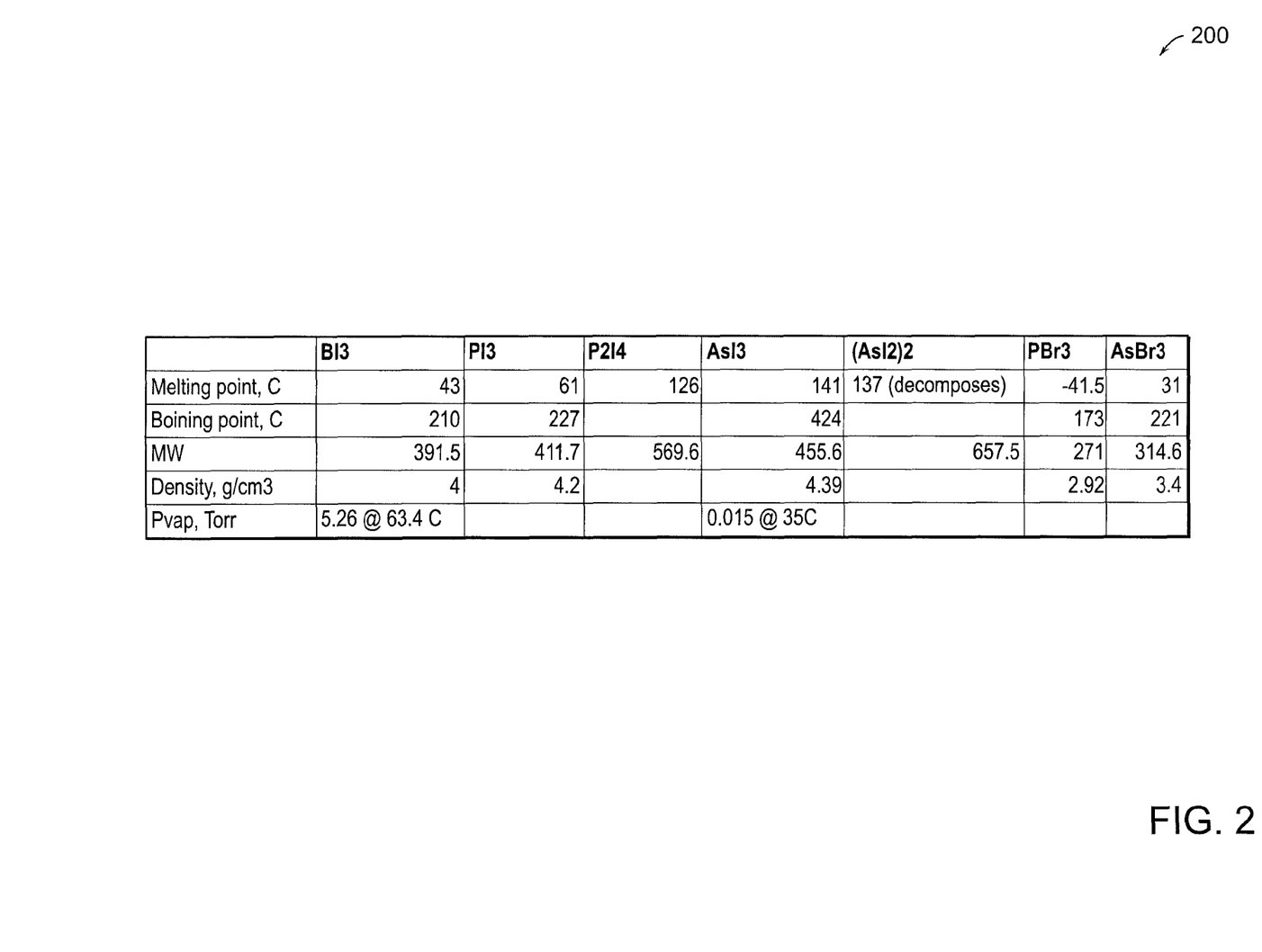
FIG. 2 presents a table of properties of iodide and bromide compound gases that can be used for plasma doping semiconductors.

FIG. 2 presents a table 200 of properties of iodide and bromide compound gases that can be used for plasma doping semiconductors. Properties are presented for $BI_3$, $PI_3$, $P_2I_4$, $AsI_3$, $(AsI_2)_2$, $PBr_3$, and $AsBr_3$ gases. Iodine and bromine atoms are relatively heavy atoms that can form compounds with some commonly used dopant atoms, such as boron and germanium. Iodine and bromine compounds are particularly suitable for use in plasma doping systems because their vapor pressures are relatively high and, therefore, they can be readily delivered into a plasma chamber. For example, the vapor pressure of $BI_3$ is 100 Torr at about 404 degrees K. The relatively high vapor pressure of $BI_3$ allows for dopant gas delivery to the plasma chamber at low temperature, which simplifies the process gas delivery system in the plasma doping apparatus. In comparison, a solid source of boron must be heated to temperatures higher than 2,000 degrees C. to provide $B^+$ ions to the substrate, which is much more difficult and costly than delivering $BI_3$ to a plasma chamber in a plasma doping system.

Another aspect of the present invention relates to balancing the undesirable sputtering and the undesirable deposition that occurs when the substrate being plasma doped is exposed to the plasma. In this embodiment of the invention, at least one of the particular kind of heavy halogenide compound in the doping gas and the energy of ions impacting the substrate is chosen so that the etching caused by physically sputtering and chemical etching of the ions is compensated, or at least partially compensated, by the deposition that occurs from the ions in the plasma. For example, in one embodiment of the invention, a particular kind of iodide and bromide compound gas in combination with plasma doping parameters, such as the substrate bias voltage, is chosen so that the etching caused by physically sputtering and chemical etching of the ions is at least partially compensated by the deposition that occurs from the ions in the plasma contacting the surface of the substrate.

Figure 3:
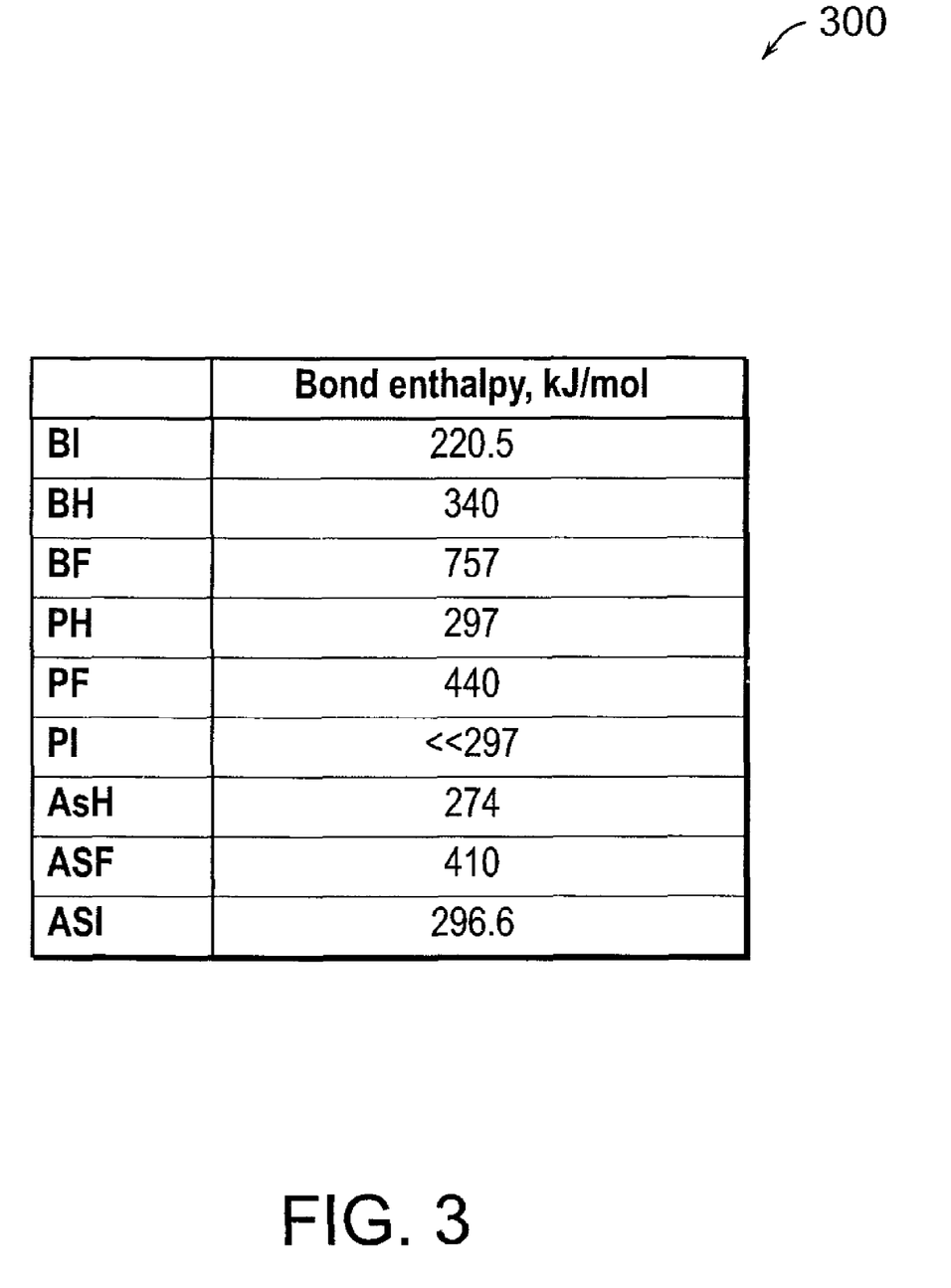
FIG. 3 presents a table of bond enthalpy values of dopant-halogen and dopant-hydrogen bonds.

FIG. 3 presents a table 300 of bond enthalpy values of dopant-halogen and dopant-hydrogen bonds. Bond enthalpy is the enthalpy change when 1 mole of bonds is broken. The bond enthalpy values in the table 300 are average values of the bond dissociation enthalpies of a particular bond in kJ/mol.

The table 300 indicates that the dopant-iodine bond enthalpy values are significantly lower than the dopant-fluorine and the dopant-hydrogen bond enthalpy values. The significantly lower dopant-iodine bond enthalpy values are due to the relatively low reactivity of iodine, which results in the strength of the dopant-iodine bond being relatively low. The relatively low dopant-iodine bond enthalpy values indicate that dopant gas with iodide implant precursors will dissociate more reality in the plasma compared with dopant gases with fluorine and hydrogen implant precursors. Therefore, a higher concentration of un-substituted $B^+$, $P^+$, $As^+$, and $Ge^+$ ions will be implanted deeper into the substrate if a dopant gas with an iodide implant precursors is used.

Undesirable iodine substitute species, such as $BI_x^+$ when $BI_x$ dopant gas is used, will be generated in the plasma chamber. However, these iodine substitute species will be implanted in the substrate with relatively low projected ranges because of the relatively high mass of the iodine substitute species. In one embodiment of the present invention, the energy of the ion implant is adjusted so that the iodine substitute species implant only into surface layers, such as oxide layers, that can be removed during subsequent processing steps, such as oxide strip steps.

Figure 4:
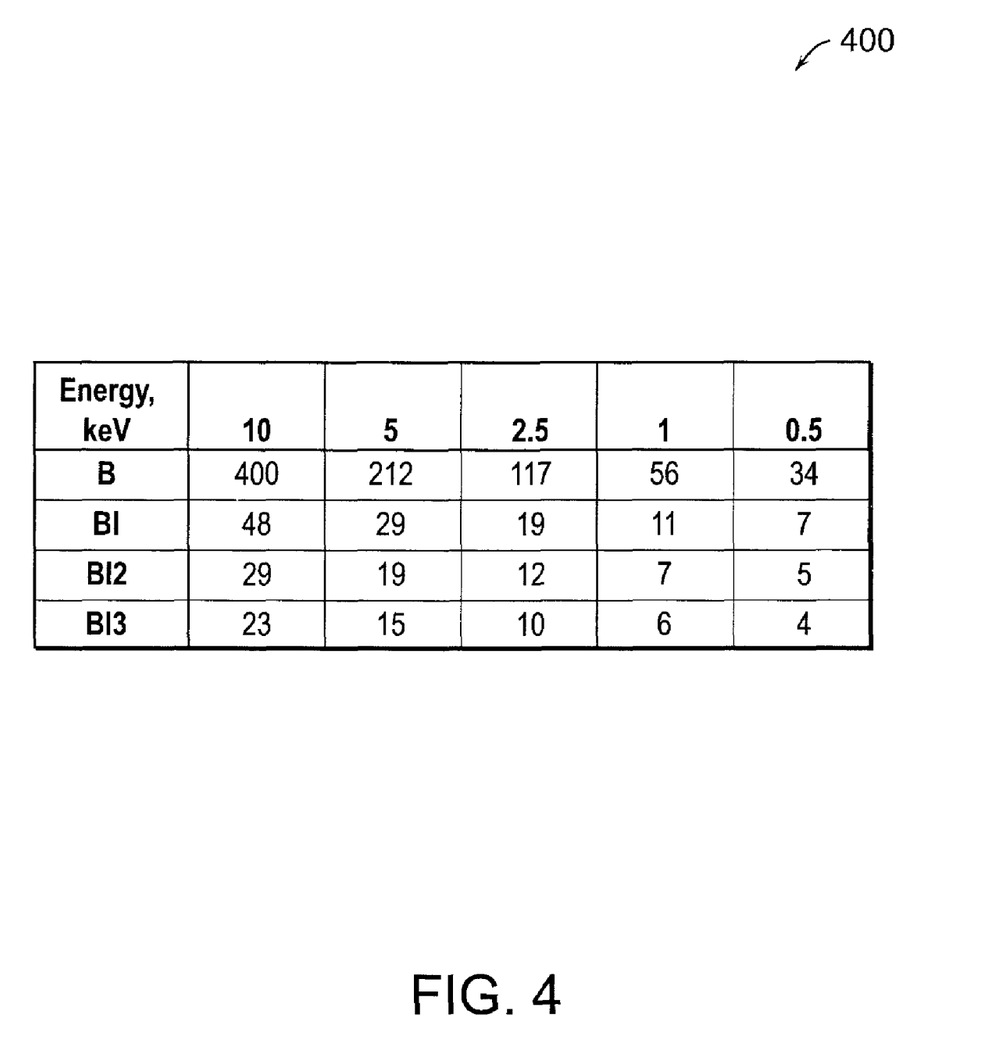
FIG. 4 presents a table of simulated ion projected ranges into silicon for ions generated with $BI_3$ P-type dopant gas feedstock.

FIG. 4 presents a table 400 of simulated ion projected ranges into silicon for ions generated with $BI_3$ P-type dopant gas feedstock. The simulated ion projected ranges are presented in Angstroms. The $BI_3$ P-type dopant gas feedstock will ionize into $BI^+$, $BI_2^+$, and $BI_3^+$ ions in the plasma chamber. Data is presented for $B^+$ boron ions and for $BI^+$, $BI_2^+$, and $BI_3^+$ boron iodine compound ions at ion implantation energies ranging from 0.5 keV to 10 keV. The simulations were performed using TRIM, which is a well known simulation program in the industry.

The table 400 indicates that the $BI^+$, $BI_2^+$, and $BI_3^+$ boron iodine compound ions are implanted into the silicon surface with projected ranges that are much lower than the projected range of the boron ions. For example, at a 5 keV ion implant energy, boron ions are implanted to a projected range of 212 Angstroms, while $BI^+$, $BI_2^+$, and $BI_3^+$ boron iodine compound ions are implanted to projected ranges of 29 Angstroms, 19 Angstroms, and 15 Angstroms, respectively. Therefore, the $BI^+$ ions, which are the deepest penetrating boron iodine compound ions, have projected ranges that are less than 14% of the projected range of the boron ions.

Thus, the resultant dopant profile is substantially determined by the boron ions and is not determined in any significant measure by the diluent fragment ions or the undesired ionic species formed from fragment ions of the dopant feed stock gas. In particular, the $BI^+$, $BI_2^+$, and $BI_3^+$ boron iodine compound ions will only contribute to the dopant profile very close to the surface of the substrate. In some embodiments of the present invention, surface layers, such as oxide or nitride layers, can be deposited prior to the plasma doping to trap these boron iodine compound ions. The surface layer can then be removed in subsequent processing steps. Therefore, the junction depth for such ion implants will be controlled entirely by the implant energy of the boron ions.

Figure 5:
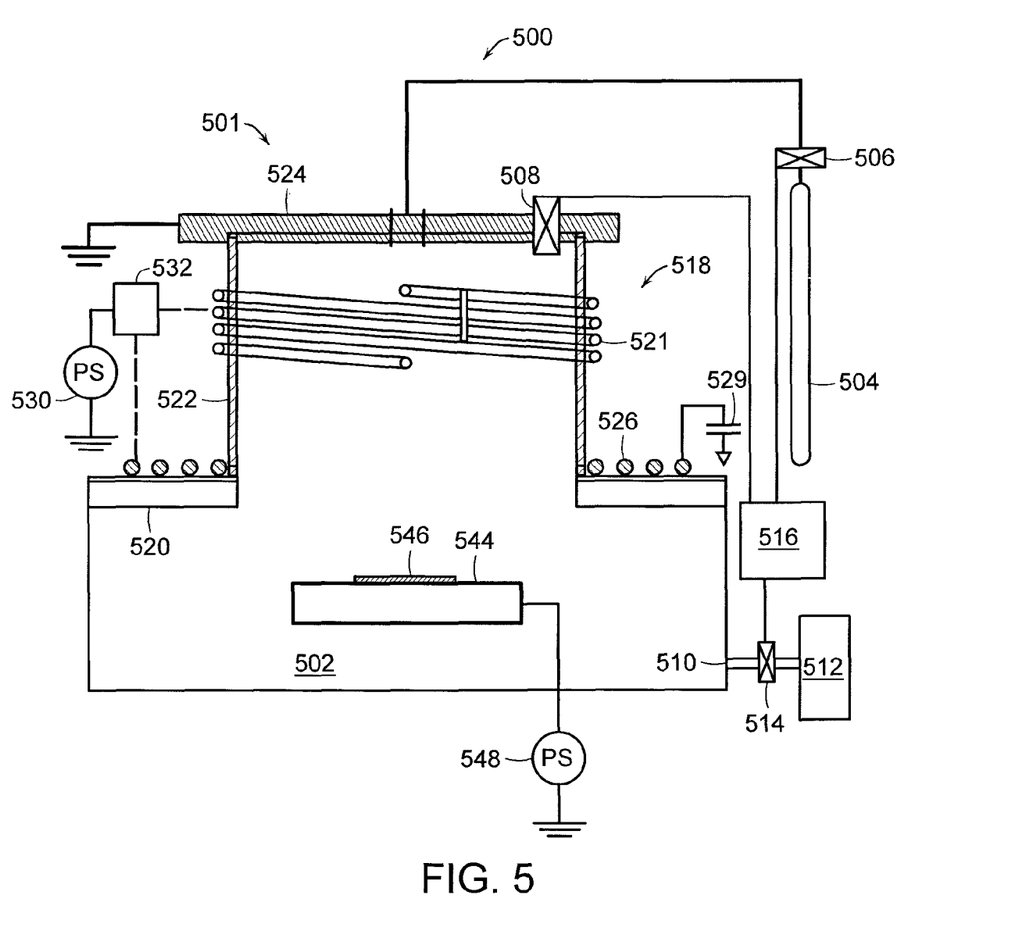
FIG. 5 illustrates a plasma doping system that can perform plasma doping according to the present invention.

FIG. 5 illustrates a plasma doping system 500 that can perform plasma doping according to the present invention. The plasma doping system 100 includes a plasma source 500. A similar plasma doping system is described in U.S. patent application Ser. No. 10/905,172, filed on Dec. 20, 2004, entitled "RF Plasma Source with Conductive Top Section," which is assigned to the present assignee. The entire specification of U.S. patent application Ser. No. 10/905,172 is incorporated herein by reference. The plasma source 501 shown in the plasma doping system 500 is well suited for plasma doping applications because it can provide a highly uniform ion flux and the source also efficiently dissipates heat generated by secondary electron emissions.

The plasma doping system 500 includes a plasma chamber 502 that contains the dopant gas feedstock supplied by an external gas source 504 that is coupled to the plasma chamber 502 through a proportional valve 506. An exhaust port 510 in the chamber 502 is coupled to a vacuum pump 512 that evacuates the chamber 502. An exhaust valve 514 controls the exhaust conductance through the exhaust port 510. A gas pressure controller 516 is electrically connected to the proportional valve 506, the pressure gauge 508, and the exhaust valve 514. The gas pressure controller 516 maintains the desired pressure in the plasma chamber 502 by controlling the exhaust conductance and the process gas flow rate in a feedback loop that is responsive to the pressure gauge 508. The exhaust conductance is controlled with the exhaust valve 514. The process gas flow rate is controlled with the proportional valve 506.

The chamber 502 has a chamber top 518 including a first section 520 formed of a dielectric material that extends in a generally horizontal direction. A second section 522 of the chamber top 518 is formed of a dielectric material that extends a height from the first section 520 in a generally vertical direction. The first and second sections 520, 522 are sometimes referred to herein generally as the dielectric window. A lid 524 of the chamber top 518 is formed of a conductive material that extends a length across the second section 522 in the horizontal direction. In some operating modes, the lid 524 is RF and DC grounded as shown in FIG. 5.

A RF antenna is positioned proximate to at least one of the first section 520 and the second section 522 of the chamber top 518. The plasma source 501 in FIG. 5 illustrates two separate RF antennas that are electrically isolated from one another. However, in other embodiments, the two separate RF antennas are electrically connected. In the embodiment shown in FIG. 5, a planar coil RF antenna 526 (sometimes called a planar antenna or a horizontal antenna) having a plurality of turns is positioned adjacent to the first section 520 of the chamber top 518. In addition, a helical coil RF antenna 528 (sometimes called a helical antenna or a vertical antenna) having a plurality of turns surrounds the second section 522 of the chamber top 518.

A RF source 530, such as a RF power supply, is electrically connected to at least one of the planar coil RF antenna 526 and helical coil RF antenna 528. In many embodiments, the RF source 530 is coupled to the RF antennas 526, 528 by an impedance matching network 532 that matches the output impedance of the RF source 530 to the impedance of the RF antennas 526, 528 in order to maximize the power transferred from the RF source 530 to the RF antennas 526, 528. Dashed lines from the output of the impedance matching network 532 to the planar coil RF antenna 526 and the helical coil RF antenna 528 are shown to indicate that electrical connections can be made from the output of the impedance matching network 532 to either or both of the planar coil RF antenna 526 and the helical coil RF antenna 528.

A platen 544 is positioned in the process chamber 502 a height below the top section 518 of the plasma source 501. The platen 544 holds a substrate 546 for plasma doping. The substrate 546 is electrically connected to the platen 544. A bias voltage power supply 548 is electrically connected to the platen 544. The platen 544 is temperature controlled. The bias voltage power supply 548 is used to bias the platen 544 and the substrate 546 so that dopant ions in the plasma are extracted from the plasma and impact the substrate 546. The bias voltage power supply 548 can be a DC power supply, a pulsed power supply, or a RF power supply. The bias voltage power supply 548 biases the substrate 546 for plasma doping.

Figure 6:
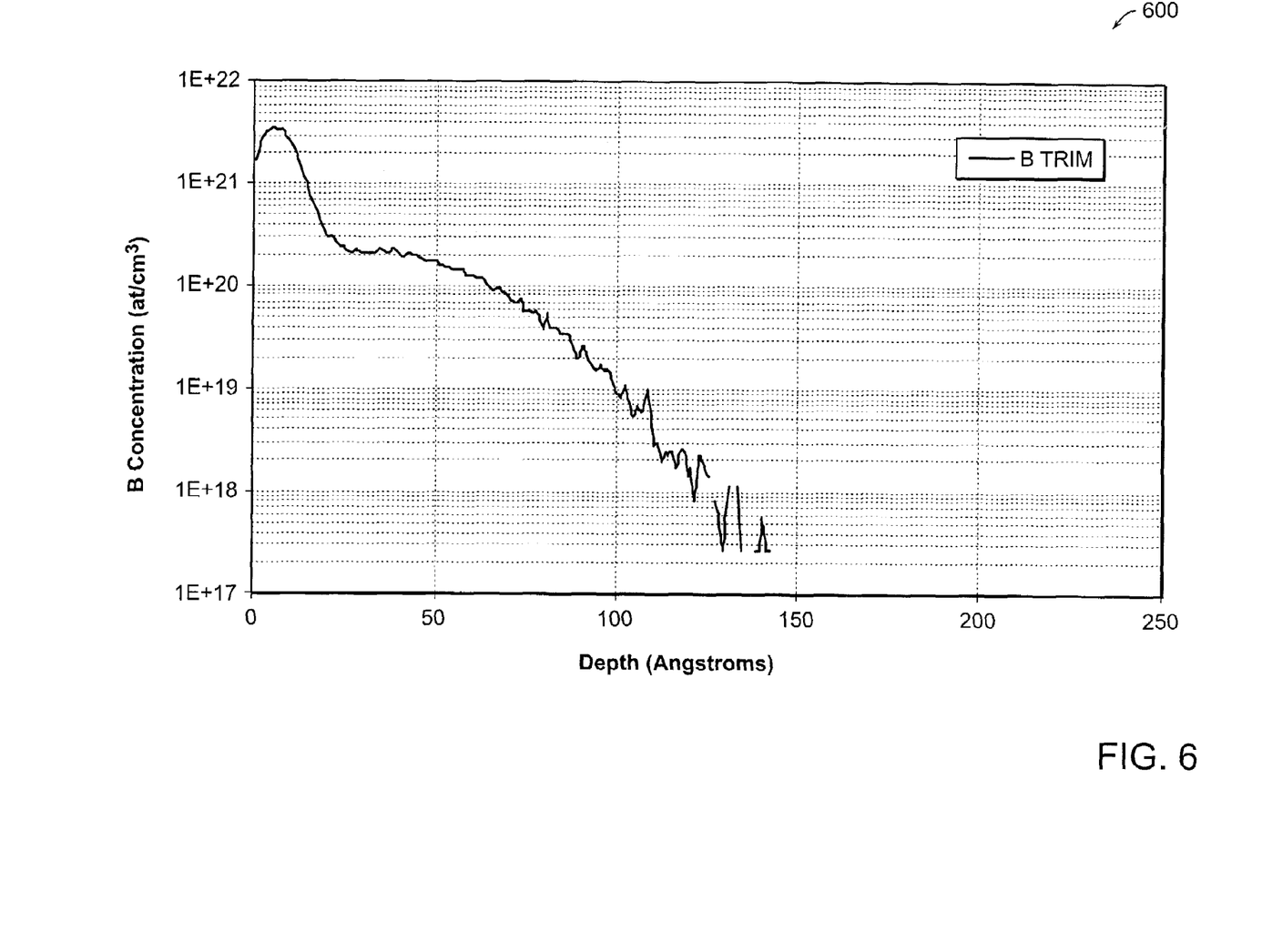
FIG. 6 presents a plasma dopant profile of boron concentration as a function of depth in a silicon substrate that was simulated for an ion implant energy of 0.5 KeV using a $BI_3$ dopant gas feedstock.

FIG. 6 presents a plasma dopant profile 600 of boron concentration as a function of depth in a silicon substrate that was simulated for an ion implant energy of 0.5 KeV using a $BI_3$ dopant gas feedstock. The plasma dopant profile 600 indicates that ultra-short junctions can be very precisely implanted using the methods of the present invention. Referring to both the profile 600 in FIG. 6 and the table 400 in FIG. 4, implanting boron ions in silicon with $BI_3$ as the dopant gas feedstock at energy of 0.5 KeV results in boron ions being implanted to a projected range of 34 Angstroms.

In contrast, $BI^+$, $BI_2^+$, and $BI_3^+$ boron iodine compound ions are implanted to projected ranges of 7 Angstroms, 5 Angstroms, and 4 Angstroms, respectively, which are very shallow implants. The surface of the silicon substrates will typically have a silicon dioxide layer or other surface layer that is greater than 7 Angstroms thick. Therefore, implanting ultra-short boron junctions in silicon with $BI_3$ as the P-type dopant gas feedstock will result in a junction that is formed by substantially only boron atoms.

One skilled in the art will appreciate that the method of plasma doping according to the present invention can be used with conventional beam line ion implantation. For example, ultra-short boron junctions can be achieved by using $BI_3$ dopant gas feedstock in conventional beam line ion implantation. A conventional ion source can be optimized to generate mostly $BI^+$ or $BI_2^+$. The ion beam can then be extracted from the ion source and directed to the surface of the substrate. Using $BI^+$ or $BI_2^+$ as a P-type dopant with beam line technology can provide a very shallow junction while maintaining a high current even in the drift mode. In addition, using a conventional beam line ion implantation system will also provide high ion implant throughput rates without significant energy contamination.

EQUIVALENTS

While the present teachings are described in conjunction with various embodiments and examples, it is not intended that the present teachings be limited to such embodiments. On the contrary, the present teachings encompass various alternatives, modifications and equivalents, as will be appreciated by those of skill in the art, which may be made therein without departing from the spirit and scope of the invention.

What is claimed is:

1. A method of plasma doping comprising:
providing a dopant heavy halogenide compound gas to a plasma chamber;
forming a plasma in the plasma chamber with the dopant heavy halogenide compound gas, the plasma generating desired dopant ions and heavy fragments of precursor dopant molecule;
forming a surface layer on a substrate;
biasing the substrate in the plasma chamber so that the desired dopant ions impact the substrate with a desired ion energy,
implanting the desired dopant ions and the heavy fragments of precursor dopant molecule into at least one of the substrate and the film, the desired dopant ions being implanted at a first depth and the heavy fragments of precursor dopant molecule being implanted at a second implant depth, the second implant depth being substantially 20% of the first implant depth or less; and
removing the surface layer after the implanting,
wherein at least one of ion energy and a composition of the dopant heavy halogenide compound is chosen so that an implant profile in the substrate is substantially determined by the desired dopant ions.

2. The method of claim 1 wherein the dopant heavy halogenide compound gas comprises a dopant iodide compound gas.

3. The method of claim 1 wherein the dopant heavy halogenide compound gas comprises $BI_3$ P-type dopant gas feedstock.

4. The method of claim 1 wherein the dopant heavy halogenide compound gas is selected from the group consisting of $PI_3$ and $AsI_3$ N-type dopant gas feedstock.

5. The method of claim 1 wherein the dopant heavy halogenide compound gas comprises a dopant bromide compound gas.

6. The method of claim 1 wherein at least one of the ion energy and the composition of dopant heavy halogenide compound gas is chosen so that etching caused by physically sputtering and chemical etching during plasina doping is at least partially compensated by deposition that occurs during plasma doping.

7. The method of claim 1 wherein at least one of the ion energy and the composition of dopant heavy halogenide compound gas is chosen to obtain a predetermined ratio of desired dopant ions to at least one of the heavy fragments of precursor dopant molecule.

8. The method of claim 1 further comprising providing $GeI_4$ gas to the plasma chamber and forming a plasma in the plasma chamber with the $GeI_4$ gas, the plasma creating species that cause at least one of pre-amorphization and strain upon implantation into the substrate.

9. The method of claim 1 wherein the plasma further generates dilutent gas ions.

10. The method of claim 9 wherein the composition of the dopant heavy halogenide compound is chosen to reduce a number of dilutent gas ions implanted into the substrate.

11. The method of claim 1 wherein the second depth is less than a thickness of the surface layer on the substrate.

12. The method of claim 11, wherein the substrate is substantially free of the heavy fragments of precursor dopant molecules.

13. A method of plasma doping comprising:
forming a surface layer on a substrate;
providing a dopant heavy halogenide compound gas to a plasma chamber;
forming a plasma in the plasma chamber with the dopant heavy halogenide compound gas, the plasma generating desired dopant ions and heavy fragments of precursor dopant molecule; and
biasing a substrate in the plasma chamber and directing the desired dopant ions and the heavy fragments of precursor dopant molecules toward the substrate;
implanting desired dopant ions into the substrate at a first ion energy;
trapping the heavy fragments precursor dopant molecules in the surface layer; and
removing the surface layer.

14. The method of claim 13 wherein the surface layer comprises an oxide layer.

15. The method of claim 13 wherein the dopant heavy halogenide compound gas comprises a dopant iodide compound gas.

16. The method of claim 13 wherein the dopant heavy halogenide compound gas comprises a dopant bromide compound gas.

17. The method of claim 13 wherein a projected range of the heavy fragments of precursor dopant molecule is less than a thickness of the surface layer.

18. The method of claim 13 wherein at least one of ion energy and composition of dopant heavy halogenide compound gas is chosen so that etching caused by physically sputtering and chemical etching during plasma doping is at least partially compensated by deposition that occurs during plasma doping.

19. The method of claim 13 wherein at least one of ion energy and composition of dopant heavy halogenide compound gas is chosen to obtain a predetermined ratio of desired dopant ions to at least one of the heavy fragments of precursor dopant molecule.

20. The method of claim 13 wherein the plasma further generates dilutent gas ions.

21. The method of claim 13, wherein the substrate is substantially free of the heavy fragments of precursor dopant molecules.

22. A method of ion implanting comprising:
forming a surface layer on a substrate;
generating dopant and dopant heavy halogenide compound ions;
accelerating the dopant and dopant heavy halogenide compound ions;
implanting the accelerated dopant and dopant heavy halogenide compound ions into at least one of the surface layer and the substrate with a desired ion energy, the desired dopant ions being implanted at a first implant depth and the dopant heavy halogenide compound ions being implanted at a second implant depth, the second implant depth being substantially 20% of the first implant depth or less; and
removing the surface layer after the implanting, wherein an implant profile in the substrate is substantially determined by the first implant depth of the desired dopant ions.

23. The method of claim 22 wherein the dopant heavy halogenide compound gas comprises a dopant iodide compound gas.

24. The method of claim 22 wherein the dopant heavy halogenide compound gas comprises a dopant bromide compound gas.

25. The method of claim 22, wherein the substrate is substantially free of the heavy fragments of precursor dopant molecules.

* * * * *